US011804926B2

United States Patent
Choi et al.

(10) Patent No.: US 11,804,926 B2
(45) Date of Patent: Oct. 31, 2023

(54) METHOD AND APPARATUS FOR PERFORMING BLOCK INTERLEAVING FOR DATA TRANSMISSION

(71) Applicant: Samsung Electronics Co., Ltd., Suwon-si (KR)

(72) Inventors: Yeonjoon Choi, Hwaseong-si (KR); Sehyoung Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 8 days.

(21) Appl. No.: 17/559,132

(22) Filed: Dec. 22, 2021

(65) Prior Publication Data

US 2022/0255663 A1    Aug. 11, 2022

(30) Foreign Application Priority Data

Feb. 9, 2021 (KR) .................. 10-2021-0018534

(51) Int. Cl.
*H04L 1/00* (2006.01)

(52) U.S. Cl.
CPC .......... *H04L 1/0057* (2013.01); *H04L 1/0047* (2013.01)

(58) Field of Classification Search
CPC ... H04L 1/0057; H04L 1/0047; H04L 1/0071; H04L 1/0014; H03M 13/276; H03M 13/2778; H03M 13/2703; H03M 13/2707; H03M 13/2789; H03M 13/6561
See application file for complete search history.

(56) References Cited

U.S. PATENT DOCUMENTS

| 6,845,482 B2 | 1/2005 | Yao et al. |
| 7,343,530 B2 | 3/2008 | Shin |
| 2007/0101210 A1* | 5/2007 | Huang ............... H03M 13/271 714/701 |

(Continued)

FOREIGN PATENT DOCUMENTS

| EP | 3584939 A1 | 12/2019 |
| EP | 3683988 A1 | 7/2020 |

(Continued)

OTHER PUBLICATIONS

Partial European Search Report dated Jun. 22, 2022 issued in corresponding European Appln. No. 22151306.2.

(Continued)

*Primary Examiner* — Sung S Ahn
(74) *Attorney, Agent, or Firm* — Harness, Dickey & Pierce, P.L.C.

(57) ABSTRACT

An apparatus includes an encoder configured to encode source data and generate a codeword composed of a plurality of bits, and an interleaver configured to perform, on the codeword, block-based interleaving including a plurality of sub-blocks, wherein the interleaver is configured to generate a first reference input index of a first reference sub-block from among the sub-blocks, generate, based on the first reference input index, a first input index of a first sub-block from among the sub-blocks, the first sub-block being arranged to be adjacent to the first reference sub-block in a first direction, and store, in an internal memory, bits corresponding to the first reference sub-block and the first sub-block, according to the first reference input index and the first input index, respectively.

18 Claims, 17 Drawing Sheets

(56) References Cited

U.S. PATENT DOCUMENTS

| | | | |
|---|---|---|---|
| 2008/0301536 A1 | 12/2008 | Shin et al. | |
| 2009/0083514 A1 | 3/2009 | Lee et al. | |
| 2018/0367202 A1 | 12/2018 | Yang et al. | |
| 2019/0044544 A1 | 2/2019 | Liao et al. | |
| 2019/0305801 A1* | 10/2019 | Kim | H03M 13/2707 |
| 2019/0305810 A1* | 10/2019 | Pham | H04L 25/0272 |
| 2020/0059249 A1* | 2/2020 | Shieh | H03M 13/271 |
| 2021/0152187 A1* | 5/2021 | Li | H04L 1/0057 |
| 2021/0367711 A1* | 11/2021 | Zhu | H04L 1/0071 |

FOREIGN PATENT DOCUMENTS

| | | |
|---|---|---|
| KR | 2005-0094304 A | 9/2005 |
| KR | 2020-0037231 A | 4/2020 |
| WO | WO-2019/207348 A1 | 10/2019 |

OTHER PUBLICATIONS

Extended European Search Report dated Nov. 22, 2022 issued in corresponding European Appln. No. 22151306.2.

\* cited by examiner

Related Art

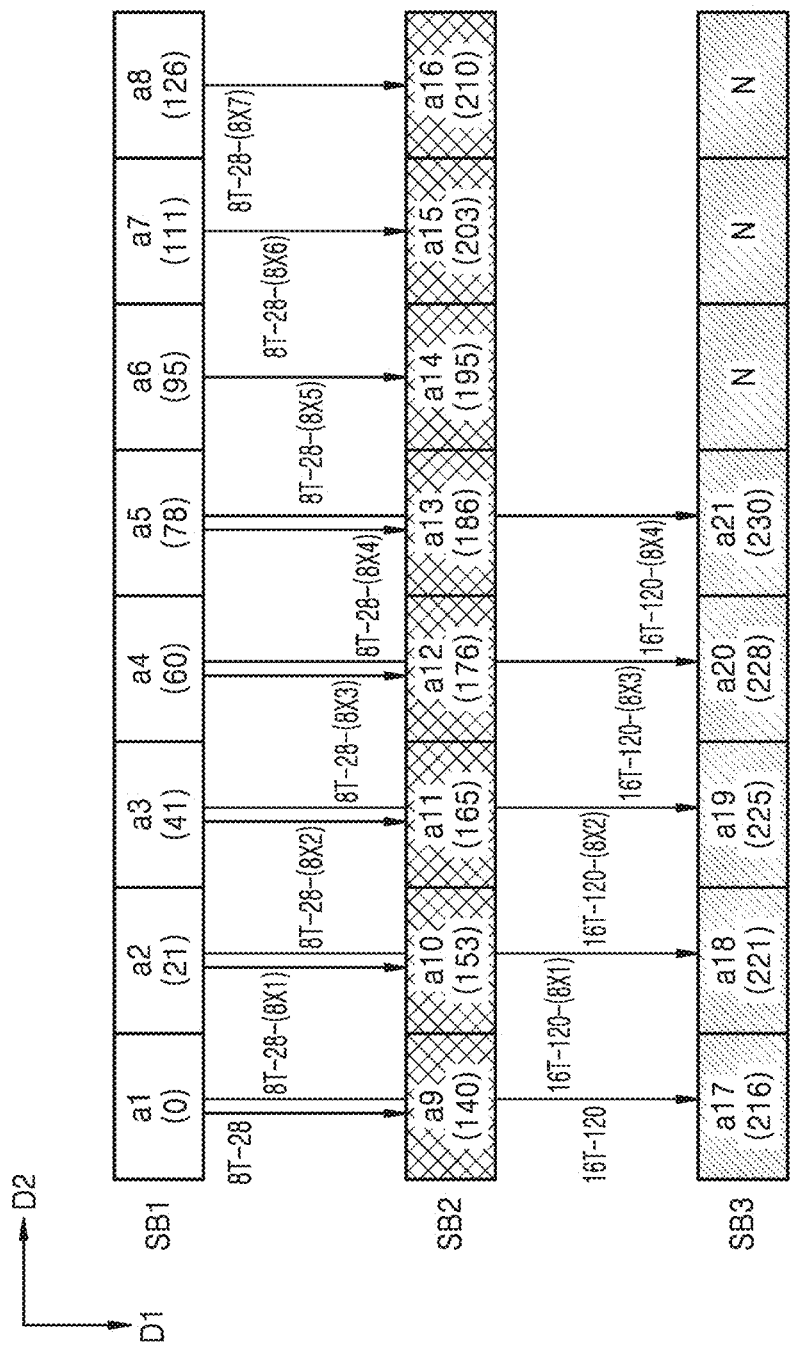

METHOD AND APPARATUS FOR PERFORMING BLOCK INTERLEAVING FOR DATA TRANSMISSION

CROSS-REFERENCE TO RELATED APPLICATION

This application is based on and claims priority under 35 U.S.C. § 119 to Korean Patent Application No. 10-2021-0018534, filed on Feb. 9, 2021, in the Korean Intellectual Property Office, the disclosure of which is incorporated by reference herein in its entirety.

BACKGROUND

The inventive concepts relate to an interleaving method, and more particularly, to a method and apparatus for performing block interleaving for data transmission.

As traffic of data required to be processed in a short time increases in a data transceiving system, the importance of a data processing speed and/or efficiency of an example embodiment of an apparatus in a system has been emphasized. Also, although the power consumed for data processing and data transceiving in the system has continually increased, an available amount of power supply is limited. Therefore, the efficiency of using power in the apparatus in the system may also be advantageous.

In various systems transceiving data, an interleaver for data transmission is inevitably used. An interleaver may change a burst error to a random error, and thus, may improve the error correction performance. Recently, an interleaver has been implemented to perform block interleaving having a shape of a right angle isosceles triangle. However, according to previous methods, computational complexity with respect to interleaving is higher, and thus, inefficiency in terms of power consumption and/or the hardware area complexity may become problematic.

SUMMARY

The inventive concepts provide a method and apparatus for performing block interleaving for decreasing the hardware area complexity and/or providing improved power efficiency.

According to an aspect of the inventive concepts, there is provided an apparatus including an encoder configured to generate a codeword composed of a plurality of bits by encoding source data, and an interleaver configured to perform, on the codeword, block-based interleaving including a plurality of sub-blocks, wherein the interleaver is configured to generate a first reference input index of a first reference sub-block from among the sub-blocks, generate, based on the first reference input index, a first input index of a first sub-block from among the sub-blocks, the first sub-block being arranged to be adjacent to the first reference sub-block in a first direction, and store, in an internal memory, bits corresponding to the first reference sub-block and the first sub-block, according to the first reference input index and the first input index, respectively.

According to another aspect of the inventive concepts, there is provided a block-based interleaving method including a plurality of sub-blocks and performed on a codeword composed of a plurality of bits, the block-based interleaving method including generating a first reference input index of a first reference sub-block from among the sub-blocks, generating, based on the first reference input index, a first input index of a first sub-block from among the sub-blocks, the first sub-block being arranged to be adjacent to the first reference sub-block in a first direction, and storing bits corresponding to the first reference sub-block and the first sub-block.

According to another aspect of the inventive concepts, there is provided an apparatus including a memory, a processor configured to encode source data and generate a codeword composed of a plurality of bits, and perform, on the codeword, block-based interleaving including a plurality of sub-blocks, and an integrated circuit configured to output data including the interleaved codeword through a predetermined or alternatively, desired channel, wherein the processor is further configured to generate first input indices of first sub-blocks from among the sub-blocks, the first sub-blocks corresponding to a first column, based on a sequential relationship between the first sub-blocks, store bits corresponding to the first sub-blocks in the memory, and output the bits stored in the memory according to first output indices of the first sub-blocks.

BRIEF DESCRIPTION OF THE DRAWINGS

Example embodiments of the inventive concepts will be more clearly understood from the following detailed description taken in conjunction with the accompanying drawings in which:

FIGS. 7A and 7B are detailed diagrams of an operation of an interleaver, according to an example embodiment;

DETAILED DESCRIPTION OF EXAMPLE EMBODIMENTS

Hereinafter, example embodiments of the inventive concepts are described in detail with reference to the accompanying drawings.

Figure 1:
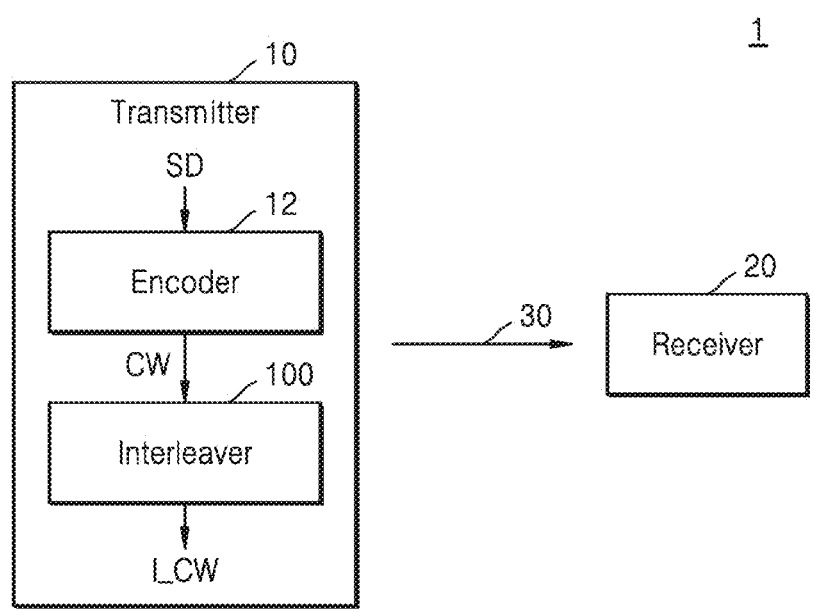
FIG. 1 is a block diagram of an electronic system according to an example embodiment.

FIG. 1 is a block diagram of an electronic system 1 according to an example embodiment. As illustrated in FIG.

1, a transmitter 10 and a receiver 20 may communicate with each other through a channel 30.

According to an example embodiment, the electronic system 1 may include an arbitrary communication system defining a communication protocol between the transmitter 10 and the receiver 20. In some example embodiments, the channel 30 may include a wireless channel using a radio resource, and the electronic system 1 may include a wireless communication system. For example, the electronic system 1 may include: a wireless communication system using a cellular network, such as a $5^{th}$ generation wireless (5G) new radio (NR) system, a long term evolution (LTE) system, an LTE-advanced system, a code division multiple access (CDMA) system, or a global system for mobile communications (GSM); a wireless personal area network (WPAN) system; or other arbitrary wireless communication systems. Also, in some example embodiments, the channel 30 may include a wired channel using an electrical signal and/or an optical signal, and the electronic system 1 may include a wired communication system.

In another example embodiment, the electronic system 1 may include a memory system or an image processing system. In some example embodiments, the channel 30 may include a wired channel using an electrical signal and/or an optical signal, and each of the transmitter 10 and the receiver 20 may correspond to a controller, a memory device, or an imaging apparatus. However, examples of the electronic system 1 implementing the inventive concepts are not limited thereto. The inventive concepts may be broadly implemented in various electronic systems transmitting and receiving data through predetermined or alternatively, desired channels. Hereinafter, the electronic system 1 will be described mainly based on a wireless communication system, in particular, a 5G NR system, as a wireless communication system using a cellular network. However, it would be understood that example embodiments of the inventive concepts are not limited thereto.

When the electronic system 1 is a wireless communication system using a cellular network, each of the transmitter 10 and the receiver 20 may be a base station (BS) or a user equipment (UE). When the transmitter 10 is a BS and the receiver is a UE, a downlink may be formed in the channel 30. In contrast, when the transmitter 10 is a UE and the receiver 20 is a BS, an uplink may be formed in the channel 30. Also, when both of the transmitter 10 and the receiver 20 are UEs, a sidelink may be formed in the channel 30. The transmitter 10 may operate as a receiver receiving a signal through the channel 30, and the receiver 20 may operate as a transmitter transmitting a signal through the channel 30.

A BS may generally refer to a fixed station communicating with a UE and/or another BS and may exchange data and control information with the UE and/or the other BS by communicating with the UE and/or the other BS. For example, the BS may be referred to as a Node B, an evolved-Node B (eNB), a next generation Node B (gNB), a sector, a site, a base transceiver system (BTS), an access point (AP), a relay node, a remote radio head (RRH), a radio unit (RU), a small cell, etc. In this specification, the BS or the cell may be interpreted to have a comprehensive meaning to indicate one or more areas or functions covered by a base station controller (BSC) in a CDMA system, a Node-B in a wideband code division multiple access (WCDMA) system, an eNB in an LTE system, a gNB of a 5G system, a sector (site), etc. and may encompass all of diverse coverage areas, such as a mega-cell, a macro-cell, a micro-cell, a pico-cell, a femto-cell, a relay node, an RRH, an RU, a small cell communication range, etc. A UE may be fixed or mobile and may refer to arbitrary devices capable of transmitting and receiving data and/or control information by communicating with a BS. For example, the UE may also be referred to as a terminal, a terminal equipment, a mobile station (MS), a mobile terminal (MT), a user terminal (UT), a subscriber station (SS), a wireless device, a handheld device, etc.

A wireless communication network between the UE and the BS may support communication between a plurality of users by sharing available network resources. For example, in the wireless communication network, information may be transmitted through various multi-access methods, such as CDMA, frequency division multiple access (FDMA), time division multiple access (TDMA), orthogonal frequency division multiple access (OFDMA), single carrier frequency division multiple access (SC-FDMA), orthogonal frequency division multiple (OFDM)-FDMA, OFDM-TDMA, OFDM-CDMA, etc.

The transmitter 10 may transmit a signal through the channel 30, and the receiver 20 may receive the signal through the channel 30. The electronic system 1 may define channel coding. Thus, the transmitter 10 may transmit an encoded signal through the channel 30, and the receiver 20 may decode the signal received through the channel 30. For example, the electronic system 1 may define the channel coding based on a polar code (or a polar sign), a Reed-Solomon code, a convolution code, etc.

As illustrated in FIG. 1, the transmitter 10 may include an encoder 12 for channel coding, and the receiver 20 may include a decoder (not shown). The encoder 12 may encode source data SD and may generate a codeword CW. The codeword CW may include an error correcting code (ECC) for correcting a bit error caused by noise, intervention, etc. generated from the channel 30. The transmitter 10 may include an interleaver 100 configured to perform block-based interleaving on the codeword CW. In addition to the channel coding of the encoder 12, the interleaver 100 may perform interleaving on the codeword CW to additionally improve the data reliability. In some example embodiments, the encoder 12 and the interleaver 100 may be integrated into one circuit included in a processor (not shown). In some example embodiments, the processor may perform channel coding and interleaving according to example embodiments.

According to an example embodiment, the interleaver 100 may perform, on the codeword CW, block-based interleaving including a plurality of sub-blocks. According to an example embodiment, a block may have a shape in which a length of a side varies according to a row and a column. For example, a block may have various shapes, such as a shape of a right angle isosceles triangle, a trapezoid shape, etc. Hereinafter, example embodiments of the inventive concepts are described based on a block having a shape of a right angle isosceles triangle. However, it would be understood that the example embodiments are not limited thereto.

According to an example embodiment, the interleaver 100 may perform interleaving by dividing a block into sub-blocks and may configure a size of the sub-blocks. For example, the interleaver 100 may configure the size of the sub-blocks based on an operation condition of the transmitter 10. The operation condition may be related to a power status (or a battery status) of the transmitter 10, the amount of data to be transmitted to the receiver 20, etc. According to an example embodiment, the sub-blocks may be configured to have a '$2^n$'-bit length (n is an integer equal to or greater than 1) in a first direction and to have a 1-bit length in a second direction intersecting with the first direction. However, this is only an example embodiment. The inventive concepts are not limited thereto, and the sub-blocks may be configured to have various sizes to form a predetermined or alternatively, desired relationship therebetween. According to a shape of the block, the block may further include sub-blocks having a different size from the sub-blocks having the $2^n$-bit length (n is an integer equal to or greater than 1) in the first direction and the 1-bit length in the second direction intersecting with the first direction. A method of generating input and output indices with respect to the sub-blocks having different sizes as described above will be described in detail below with reference to FIGS. 11 and 12.

The interleaver 100 may write bits of the codeword CW in consecutive rows of the block from a left direction to a right direction and read bits of the codeword CW in consecutive columns of the block from a top direction to a bottom direction. Hereinafter, a direction from a top end to a bottom end may be referred to as a first direction or a column direction, and a direction from a left end to a right end may be referred to as a second direction or a row direction. In some example embodiments, the first direction and the second direction may vary according to an implemented example of a block or an interleaving method.

In order to write the bits of the codeword CW, the interleaver 100 may generate an input index (or an input address) of each of the bits. Also, in order to read the bits of the codeword CW from the block, the interleaver 100 may generate an output index (or an output address) of each of the bits. That is, the interleaver 100 may write the bits of the codeword CW in the block according to the generated input indices and read the bits of the codeword CW from the block according to the generated output indices. The block may correspond to a virtual space of an internal memory of the interleaver 100. Thus, writing and reading with respect to the block may denote writing and reading with respect to the internal memory.

According to an example embodiment, the interleaver 100 may generate a first reference input index of a first reference sub-block in a first column of the block and, based on the first reference input index, may generate a first input index of at least one first sub-block, which is arranged with the first reference sub-block in the first direction. An input index of a sub-block may include a plurality of input indices respectively corresponding to the bits written in the sub-block. According to an example embodiment, the interleaver 100 may configure a size of the sub-blocks such that the first reference input index and the first input index may form an inter-sequential relationship. Hereinafter, the sequential relationship between the sub-blocks may denote a sequential relationship between input indices respectively corresponding to the sub-blocks. According to an example embodiment, the interleaver 100 may generate the first input index through simple addition, subtraction, and shifting by using the first reference input index.

According to an example embodiment, the interleaver 100 may generate a second reference input index of a second reference sub-block in a second column of the block and, based on the second reference input index, may generate a second input index of at least one second sub-block arranged with the second reference sub-block in the first direction.

According to another example embodiment, the interleaver 100 may generate the second input index of the at least one second sub-block in the second column of the block by using the first reference input index or the first input index previously generated. The first sub-block arranged in the first column and the second sub-block arranged in the second column may form a predetermined or alternatively, desired relationship. The interleaver 100 may generate the second input index based on the first reference input index or the first input index by taking into account this relationship.

The interleaver 100 may take into account a predetermined or alternatively, desired relationship between the sub-blocks and may generate input indices of all sub-blocks through a simple calculation, as described above according to the example embodiments. The interleaver 100 may write the bits of the codeword CW in the internal memory according to the generated input indices. The interleaver 100 may generate output indices of the sub-blocks and may read the bits of the codeword CW from the internal memory according to the output indices to output an interleaved codeword I_CW.

In some example embodiments, the interleaved codeword I_CW may be transmitted to the receiver 20 through the channel 30, after additional interleaving is performed on the sub-blocks in addition to the block interleaving described above.

The interleaver 100 according to an example embodiment may use the relationship between the sub-blocks and generate the input indices for interleaving through a simple calculation, and thus, a hardware design of the interleaver 100 may become simple, and power may be efficiently used. As a result, the general performance of the transmitter 10 may be improved.

According to an example embodiment, the receiver 20 may further include a de-interleaver (not shown) and may re-arrange the interleaved codeword I_CW to its original order by using the de-interleaver. In some example embodiments, the de-interleaver may also implement the inventive concepts of the interleaver 100 described above. Thus, the de-interleaver may perform de-interleaving through a simple calculation. Also, the receiver 20 may further include a decoder (not shown) and may decode the de-interleaved codeword into source data by using the decoder.

Also, the transmitter 10 may further include a de-interleaver (not shown) performing de-interleaving on a signal received from the outside and a decoder (not shown) performing decoding on the de-interleaved signal. For example, the de-interleaver may be configured to perform a de-interleaving operation corresponding to an operation of the interleaver 100.

Figure 2:
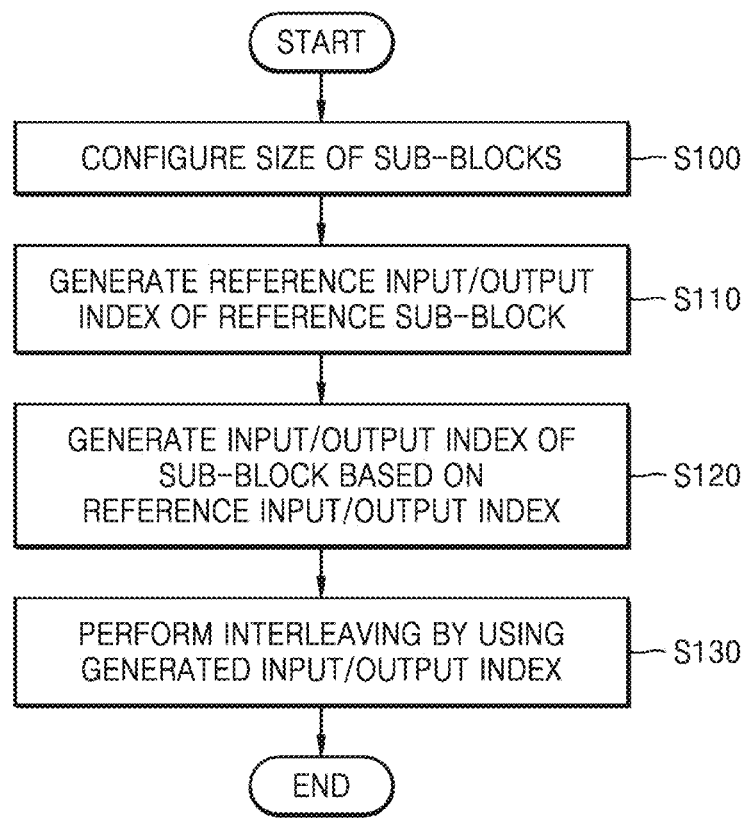
FIG. 2 is a flowchart of a block interleaving operation of an interleaver, according to an example embodiment.

FIG. 2 is a flowchart of a block interleaving operation of an interleaver, according to an example embodiment.

Referring to FIG. 2, in operation S100, the interleaver may configure a size of sub-blocks included in a block. For example, the interleaver may adaptively configure the size of the sub-blocks with respect to an operational status of an apparatus. The interleaver may configure the size of the sub-blocks to have a $2^n$-bit length (n is an integer equal to or greater than 1) in a first direction and to have a 1-bit length in a second direction intersecting with the first direction.

In operation S110, the interleaver may generate a reference input and output index of a reference sub-block in a first column of the block. Hereinafter, the input and output index includes an input index and an output index.

In operation S120, the interleaver may generate, based on the reference input and output index, an input and output index of a sub-block arranged in the first column of the block to be parallel with the reference sub-block in the first direction. For example, the interleaver may generate the input index based on the reference input index, based on a sequential relationship between the reference sub-block and the sub-block. Also, the interleaver may generate the output index of the sub-block in the same manner. In operation S120, the interleaver may generate input and output indices of sub-blocks of columns of the block other than the first column, by using the method described in operation S120.

In operation S130, the interleaver may perform block-based interleaving by using the generated input and output indices. According to an example embodiment, the interleaver may write bits of a codeword in an internal memory according to the generated input indices of the sub-blocks and may read the bits of the codeword from the internal memory according to the generated output indices of the sub-blocks. In this way, the interleaver may perform the block-based interleaving.

Figure 3:
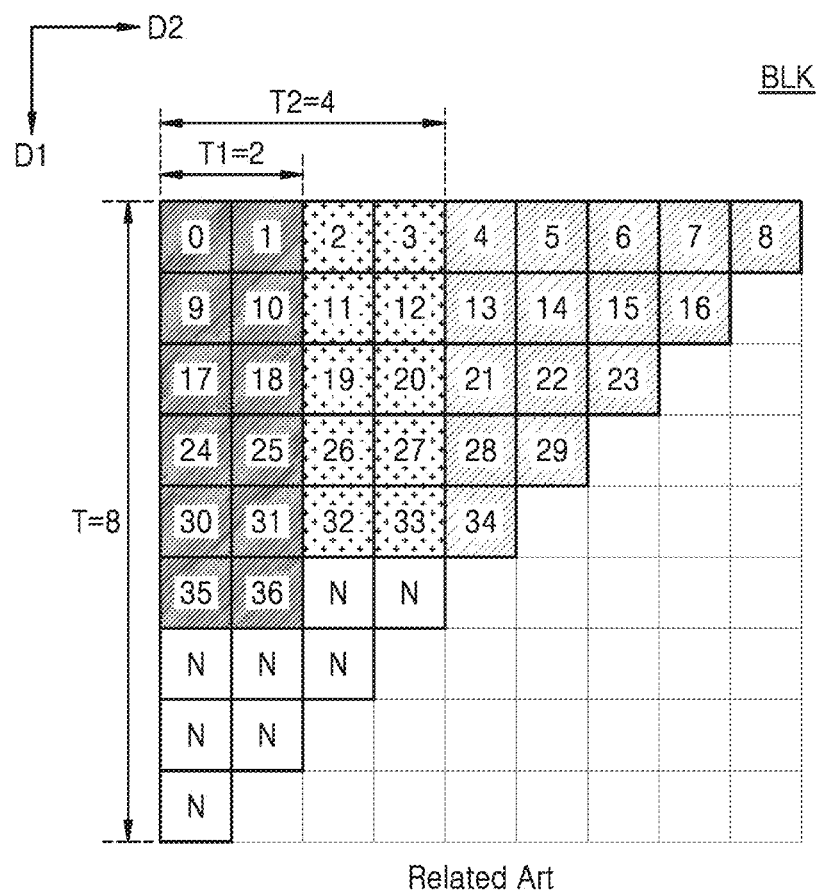
FIG. 3 is a diagram of a comparative embodiment of an example embodiment.
Figure 3:
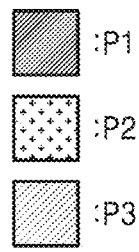

FIG. 3 is a diagram of a comparative embodiment of an example embodiment of the inventive concepts. FIG. 3 illustrates one example for a comparison with example embodiments. It would be obvious that the inventive concepts should not be interpreted to be limited to the example illustrated in FIG. 3.

Referring to FIG. 3, a block BLK may have a shape of a right angle isosceles triangle.

A length T of a side of the block BLK may be configured based on [Equation 1].

$$T \times (T+1)/2 \geq E \qquad \text{Equation 1}$$

A codeword written in the block BLK may be composed of E bits. A minimum value of the values satisfying [Equation 1] may be the length T of one side of the block BLK. For example, the length T of one side of the block BLK may correspond to an 8-bit length. Null data is written in portions of the block BLK that are indicated as N, and the number D of pieces of null data may correspond to [Equation 2].

$$D = T \times (T+1)/2 - E \qquad \text{[Equation 2]}$$

The block BLK may include first through third portions P1 through P3, and a length T2 of a side to the second portion P2 may be configured based on [Equation 3].

$$T2 \times (T2+1) \geq D \qquad \text{[Equation 3]}$$

A minimum value from among the values satisfying [Equation 3] may be the length T2 of the side to the second portion P2. For example, the length T2 may correspond to a 4-bit length.

A length T1 of the side to the first portion P1 may be configured based on [Equation 4].

$$T1 = T2 \times (T2+1) - D \qquad \text{[Equation 4]}$$

In the comparative embodiment, the interleaver may use the following algorithm when generating input and output indices in the first portion P1.

for ((i=0; i<T1; i++)//i: column index
{
for(j=0; j<T-T2+1; j++)//j: row index
{Output index=i*(T-T2+1)+j
Input index=i+j*T-j*(j-1)/2}

0 through 36 written in the block BLK may indicate the input indices of the bits of the codeword that are written in the block BLK. As described in the algorithm described above, the bits of the codeword may be written in consecutive rows of the block BLK from a left direction to a right direction according to the input indices, and the bits of the codeword in consecutive columns of the block BLK may be read from a top direction to a bottom direction according to the output indices.

In the comparative embodiment, the interleaver has to perform a complex calculation, such as multiplication and division, in order to generate the input indices in the first portion P1. Thus, the hardware complexity and/or power consumption of the interleaver may be increased.

Figure 4:
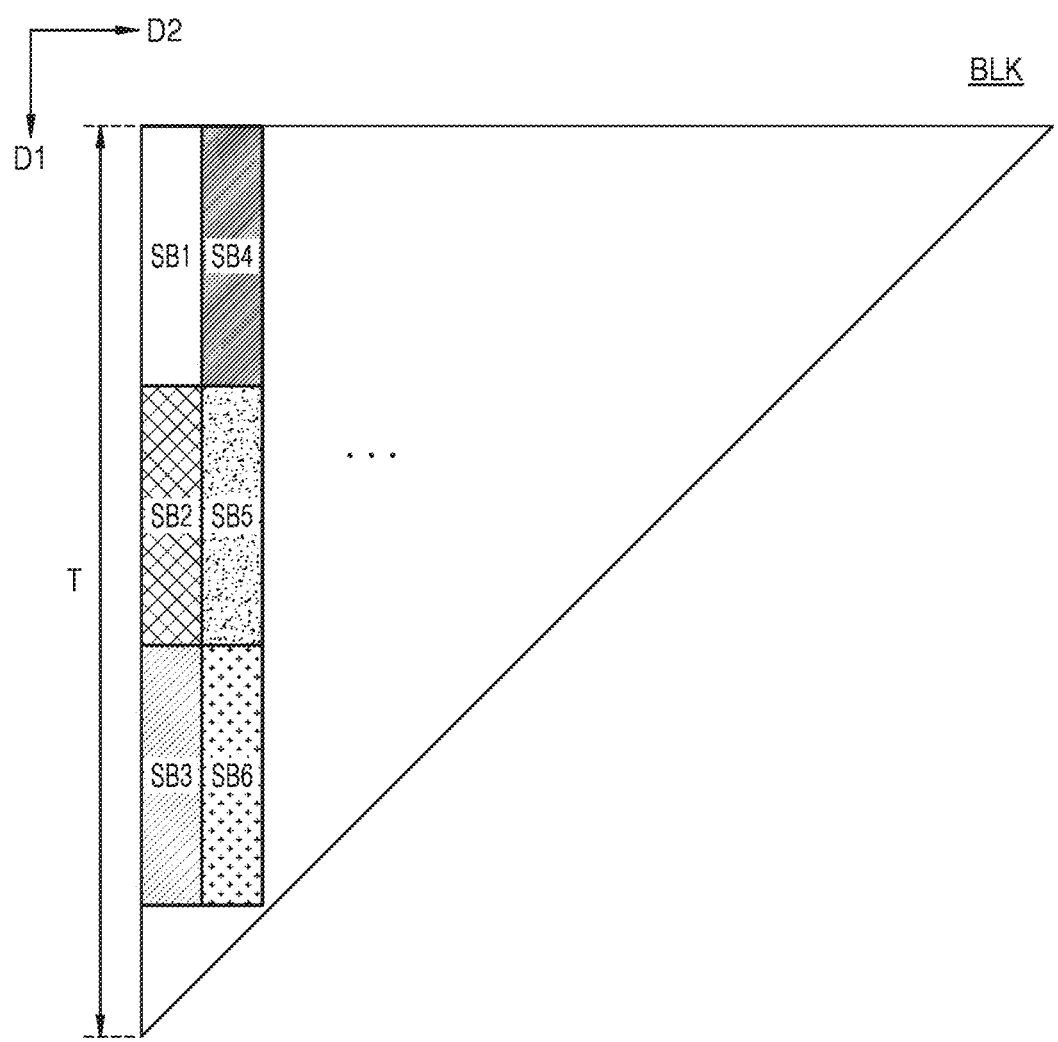
FIG. 4 is a diagram of a block according to an example embodiment.

FIG. 4 is a diagram of the block BLK according to an example embodiment. Hereinafter, the block BLK is an example for helping understand the inventive concepts. Only one or more sub-blocks SB1 through SB6 are illustrated, and example embodiments of the inventive concepts may be implemented by using blocks having various shapes, in addition to the block BLK of FIG. 4.

Referring to FIG. 4, the block BLK may include first through sixth sub-blocks SB1 through SB6. The block BLK may have a shape of a right angle isosceles triangle, and a length of one side may correspond to a T-bit length.

According to an example embodiment, the first through sixth sub-blocks SB1 through SB6 may have a $2^n$-bit length that is less than T in a first direction D1 (or a column direction) and may have a 1-bit length in a second direction D2 (or a row direction).

According to an example embodiment, the interleaver may generate input indices of the first through third sub-blocks SB1 through SB3 corresponding to a first column. For example, the interleaver may select the first sub-block SB1 as a reference sub-block and may generate the input indices of the second and third sub-blocks SB2 and SB3 by using the input index of the first sub-block SB1. That is, the first sub-block SB1 and the second sub-block SB2 may form an inter-sequential relationship. Also, the first sub-block SB1 and the third sub-block SB3 may form an inter-sequential relationship. In some example embodiments, the interleaver may generate the input index of the second sub-block SB2 and the input index of the third sub-block SB3 by using the input index of the first sub-block SB1 in a parallel fashion. To this end, the interleaver may include at least two interleaving circuits. The interleaver may use the input index of the first sub-block SB1 may generate the input indices of the second and third sub-blocks SB2 and SB3 by using addition, subtraction, and shifting. The number of bits written in the first through sixth sub-blocks SB1 through SB6 is $2^n$, and thus, the shifting calculation for generating the input indices may replace multiplication.

According to an example embodiment, the interleaver may generate input indices of the fourth through sixth sub-blocks SB4 through SB6 corresponding to a second column. For example, the interleaver may select the fourth sub-block SB4 as a reference sub-block and may use the input index of the fourth sub-block SB4 to generate the input indices of the fifth and sixth sub-blocks SB5 and SB6. That is, the fourth sub-block SB4 and the fifth sub-block SB5 may form an inter-sequential relationship. Also, the fourth sub-block SB4 and the sixth sub-block SB6 may form an inter-sequential relationship.

As another example, the interleaver may generate the input indices of the fourth through sixth sub-blocks SB4 through SB6 by using the generated input indices of the first through third sub-blocks SB1 through SB3. For example, the interleaver may generate the input index of the fourth sub-block SB4 by adding a predetermined or alternatively, desired constant to the input index of the first sub-block SB1. The interleaver may generate the input index of the fifth sub-block SB5 by adding a predetermined or alternatively, desired constant to the input index of the second sub-block SB2. Also, the interleaver may generate the input index of the sixth sub-block SB6 by adding a predetermined or alternatively, desired constant to the input index of the third sub-block SB3. The constants may be determined according to a distance difference between the sub-blocks. For example, when generating the input index of the sub-block corresponding to the second column based on the input index of the sub-block corresponding to the first column, the constant may be determined as 1, and when generating an input index of a sub-block corresponding to a third column based on the input index of the sub-block corresponding to the first column, the constant may be determined as 2. In order to generate input indices of sub-blocks of other columns, the interleaver may, in advance, store, in the internal memory, input indices of sub-blocks of a column, which is a reference for the other columns, and may read the input indices from the internal memory whenever necessary.

The interleaver according to an example embodiment may generate input indices of the rest of the sub-blocks, which are not illustrated, by using the same method as described above. Also, the interleaver may perform block-based interleaving using the internal memory by generating output indices of the sub-blocks.

Figure 5:
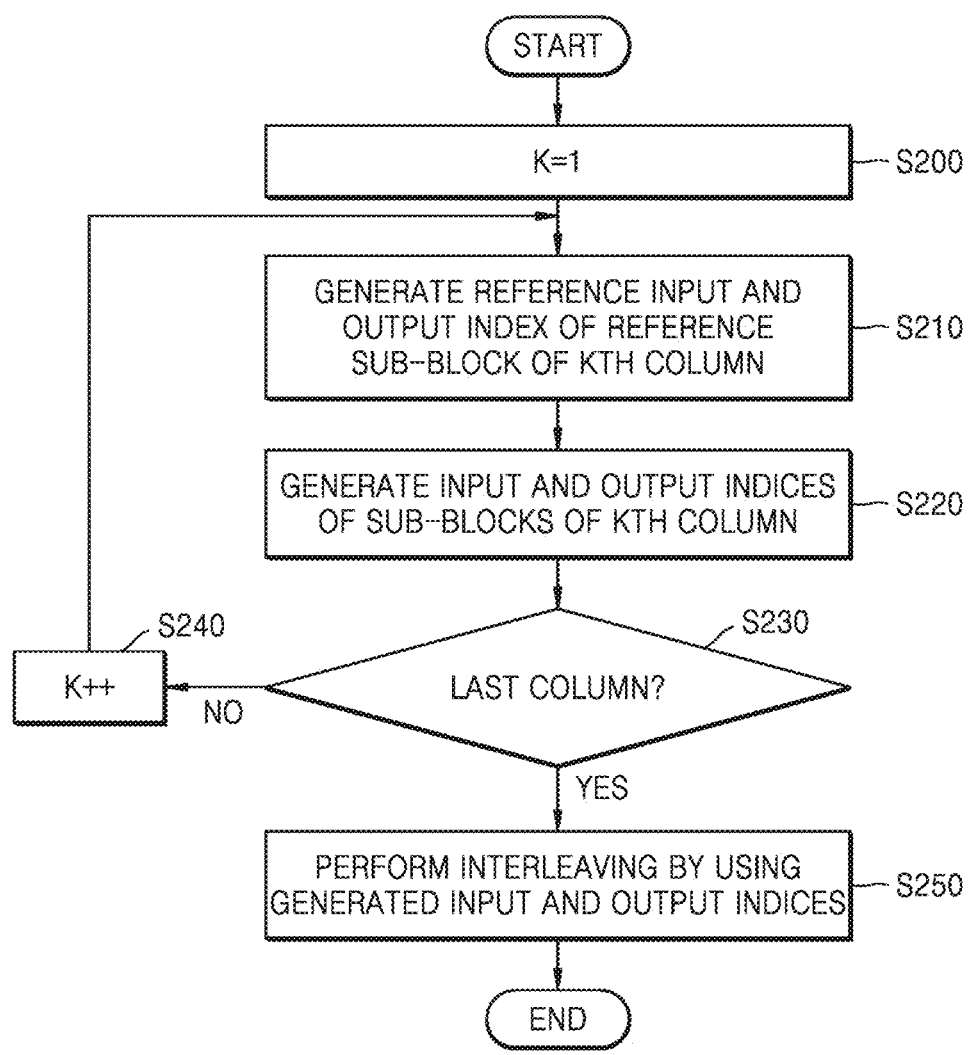
FIG. 5 is a flowchart of an operating method of an interleaver, according to an example embodiment.

FIG. 5 is a flowchart of an operating method of an interleaver, according to an example embodiment.

Referring to FIG. 5, in operation S200, the interleaver may set k (k is an integer equal to or greater than 1) to 1, and in operation S210, may generate a reference input and output index of a reference sub-block of a $k^{th}$ column of a block. In operation S220, the interleaver may generate an input and output index of a sub-block of the $k^{th}$ column of the block. According to an example embodiment, the interleaver may generate, based on the reference input index of the reference sub-block of the $k^{th}$ column, an input index of a sub-block arranged with the reference sub-block in a first direction. The $k^{th}$ column of the block may include the reference sub-block and a plurality of sub-blocks. In some example embodiments, in operation S220, the interleaver may generate input indices of the plurality of sub-blocks by using the reference input index of the reference sub-block. In some example embodiments, the interleaver may perform the generation of the input indices of the plurality of sub-blocks by using the reference input index of the reference sub-block, in a parallel fashion. For example, the interleaver may generate an input index of a first sub-block of the $k^{th}$ column and an input index of a second sub-block of the $k^{th}$ column by using the reference input index, in a parallel fashion.

In operation S230, the interleaver may determine whether or not the $k^{th}$ column is the last column of the block. When the $k^{th}$ column is not the last column of the block (NO) in operation S230, operation S240 may be subsequently performed, in which the interleaver may count up to k. Then, operation S210 may be performed next. FIG. 5 illustrates that the input and output indices with respect to the sub-blocks of the block are sequentially generated based on a column. However, it is not limited thereto, and the interleaver may generate input and output indices corresponding to each column in a parallel fashion.

Otherwise, when the $k^{th}$ column is the last column of the block (YES) in operation S240, operation S250 may be subsequently performed, in which the interleaver may perform interleaving by using generated input and output indices of the sub-blocks of the block.

Figure 6:
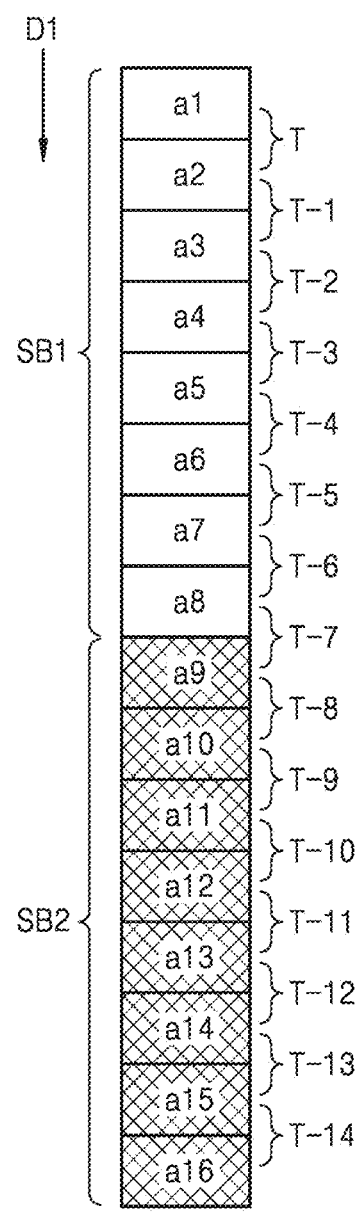
FIG. 6 is a diagram of a sequential relationship between a first sub-block and a second sub-block arranged in the same column, according to an example embodiment.

FIG. 6 is a diagram of a sequential relationship between a first sub-block SB1 and a second sub-block SB2 arranged in the same column, according to an example embodiment. The first and second sub-blocks SB1 and SB2 of FIG. 6 are assumed to correspond to the first and second sub-blocks SB1 and SB2 of the block BLK of FIG. 4. However, the example embodiment described with reference to FIG. 6 is merely for helping understanding the inventive concepts, and the inventive concepts are not limited thereto. The inventive concepts may be implemented by applying different sequential relationships between the first and second sub-blocks SB1 and SB2, which are formed according to a block, a shape of a sub-block, a method of interleaving, etc.

Referring to FIG. 6, the first sub-block SB1 may include first through eighth elements a1 through a8 arranged in a first direction D1 (or a column direction), and the second sub-block SB2 may include ninth through sixteenth elements a9 through a16 arranged in the first direction D1 (or the column direction). An element may denote a virtual space in which one bit is written according to an input index or from which a bit is read according to an output index. Hereinafter, the relationship between the first sub-block SB1 and the second sub-block SB2 is described based on input indices, and an input index of an element may denote an input index of a bit corresponding to the element.

The relationship between the input indices respectively corresponding to the first through eighth elements a1 through a8 in the first sub-block SB1 and the ninth through sixteenth elements a9 through a16 in the second sub-block SB2 is the same as illustrated in FIG. 6. That is, the input index of the first element a1 may have a difference from the input index of the second element a2, the difference corresponding to the length T of one side of the block BLK of FIG. 4. The input index of the second element a2 may have a difference from the input index of the third element a3, the difference corresponding to a length T−1. That is, the input indices of the first through sixteenth elements a1 through a16 may have a sequential relationship as [Equation 5] below.

$$an\_II = a1\_II + \sum_{k=1}^{n-1} bk \quad \text{[Equation 5]}$$

$$bk = T - (k-1)$$

$$Sn = \frac{n \times (b1 + bn)}{2} = \frac{n[2 \times b1 + (n-1) \times d]}{2}$$

An input index an_II of the first through sixteenth elements a1 through a16 may have a difference sequence. A difference bk is an equal difference sequence, and a resultant value of adding a sum Sn of the difference bk with an initial input index a1_II may correspond to the input index an_II.

Assuming T=21 and a tolerance (d)=1, the relationship between the first through eighth elements a1 through a8 of the first sub-block SB1 and the ninth through sixteenth elements a9 through a16 of the second sub-block SB2 corresponds to [Equation 6].

$$a(n+8)\_II\_SB2 = an\_II\_SB1 + 21 \times 8 - 28 - (n-1) \times 8 \quad \text{[Equation 6]}$$

That is, an input index a(n+8)_II_SB2 of the ninth through sixteenth elements a9 through a16 of the second sub-block SB2 and an input index an_II_SB1 of the first through eighth elements a1 through a8 of the first sub-block SB1 may have a sequential relationship as [Equation 6].

According to an example embodiment, the interleaver may generate the input index an_II_SB1 of the first sub-block SB1, and then, by taking into account the relationship between the first sub-block SB1 and the second sub-block SB2, may generate the input index a(n+8)_II_SB2 of the second sub-block SB2 based on [Equation 6]. In [Equation 6], multiplication may be replaced by shifting because the first and second sub-blocks SB1 and SB2 are composed of $2^n$ elements. Thus, the interleaver may generate the input index a(n+8)_II_SB2 of the second sub-block SB2 by performing simple addition, subtraction, and shifting based on [Equation 6].

Figure 7B:
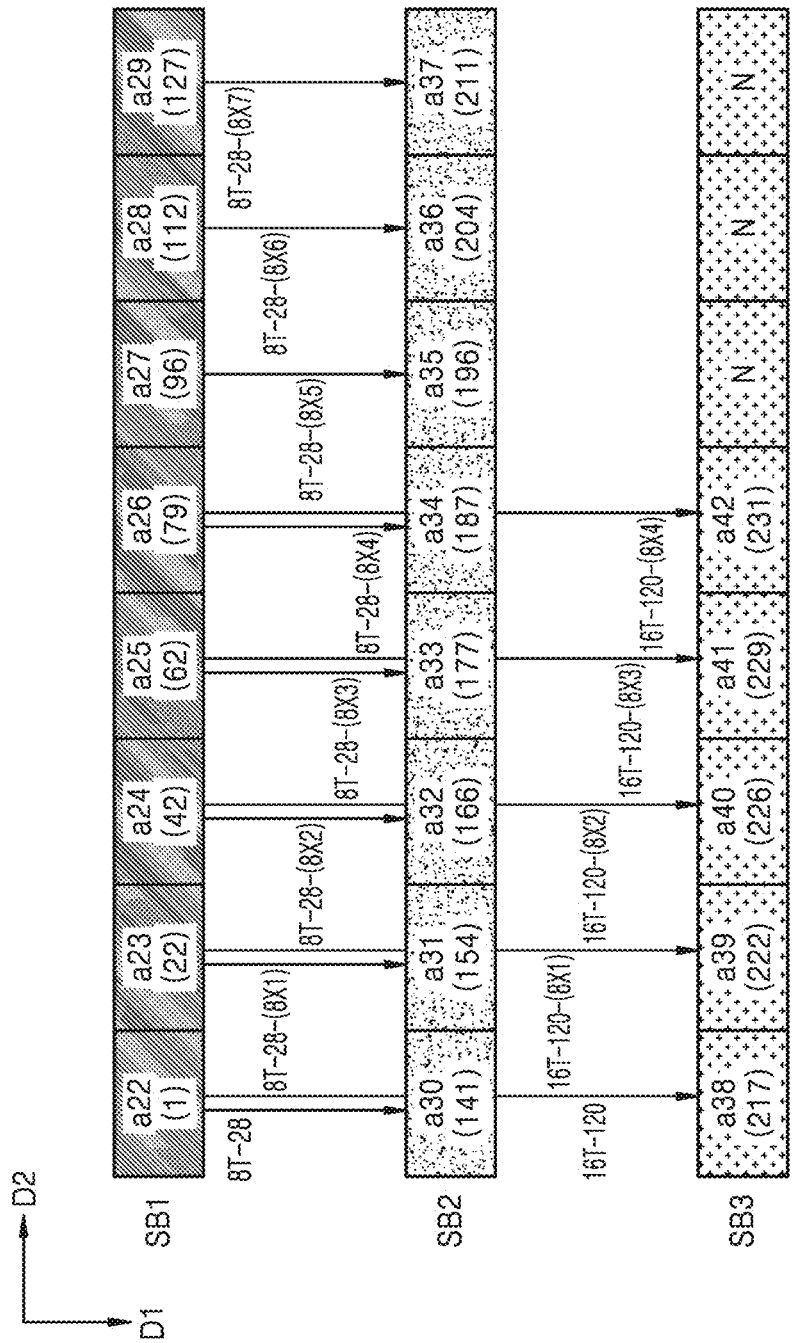

FIGS. 7A and 7B are detailed diagrams of an operation of an interleaver, according to an example embodiment. The example embodiment illustrated in FIGS. 7A and 7B are based on the example embodiment illustrated in FIGS. 4 through 6.

Referring to FIG. 7A, the input index an_II_SB1 of the first through eighth elements a1 through a8 of the first sub-block SB1 may be generated based [Equation 5] of FIG. 6 and may have values of 0, 21, 41, 60, 78, 95, 111, 126. The input index a(n+8)_II_SB2 of the ninth through sixteenth elements a9 through a16 of the second sub-block SB2 may be generated based on the input index an_II_SB1 of the first through eighth elements a1 through a8, based on [Equation 6] of FIG. 6, and may have values of 140, 153, 165, 176, 186, 195, 203, 210.

A relationship between the first through eighth elements a1 through a8 of the first sub-block SB1 and seventeenth through twenty-first elements a17 through a21 of a third sub-block SB3 corresponds to [Equation 7] below.

$$a(n+16)\_II\_SB3 = an\_II\_SB1 + 21 \times 16 - 120 - (n-1) \times 8 \quad \text{[Equation 7]}$$

That is, an input index a(n+16)_II_SB3 of the seventeenth through twenty-first elements a17 through a21 of the third sub-block SB3 and the input index an_II_SB1 of the first through eighth elements a1 through a8 of the first sub-block SB1 may have a sequential relationship as [Equation 7]. Null (N) data may be written in the rest areas of the third sub-block SB3, and this aspect is not described.

The input index a(n+16)_II_SB3 of the seventeenth through twenty-first elements a17 through a21 of the third sub-block SB3 may be generated based on the input index of the first through fifth elements a1 through a5, based on [Equation 7], and may have values of 216, 221, 225, 228, 230.

According to an example embodiment, the interleaver may perform the generation of the input index of the second sub-block SB2 and the generation of the input index of the third sub-block SB3 in a parallel fashion. A detailed example embodiment with respect to this aspect will be described in detail below with reference to FIG. 8A.

Referring further to FIG. 7B, an input index of twenty-second through twenty-ninth elements a22 through a29 of a fourth sub-block SB4 may have values of 1, 22, 42, 61, 79, 95, 111, 127. An input index of thirtieth through thirty-seventh elements a30 through a37 of a fifth sub-block SB5 may be generated based on the input index of the twenty-second through twenty-ninth elements a22 through a29, based on [Equation 6] of FIG. 6, and may have values of 141, 154, 166, 177, 187, 196, 204, 211.

An input index of thirty eighth through forty-second elements a38 through a42 of a sixth sub-block SB6 may be generated based on the input index of the twenty second through twenty-sixth elements a22 through a26, based on [Equation 7], and may have values of 217, 222, 226, 229, 231.

Figure 8A:
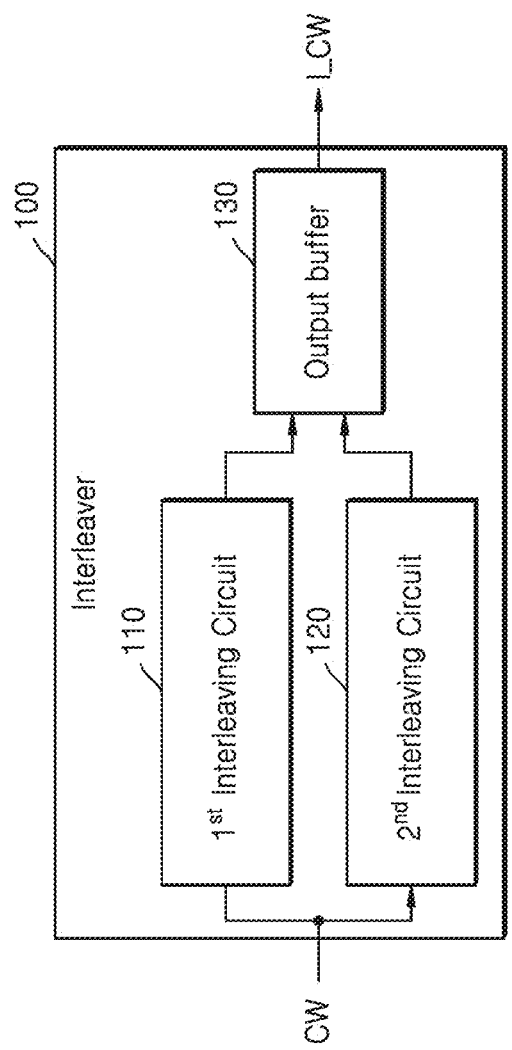
FIG. 8A is a block diagram of components of an interleaver according to an example embodiment.
Figure 8B:
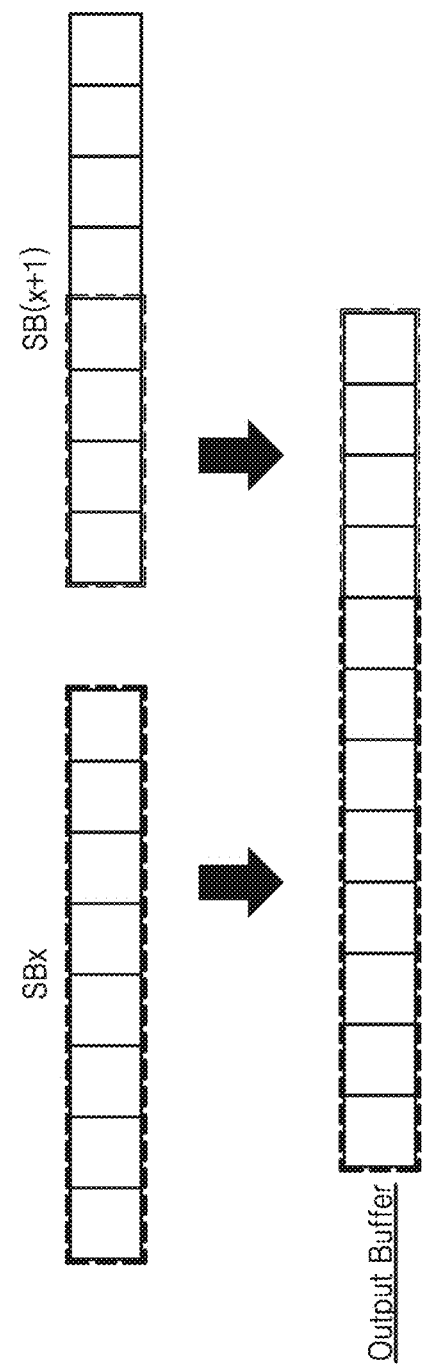
FIG. 8B is a diagram of an output of the interleaver of FIG. 8A.

FIG. 8A is a block diagram of components of the interleaver 100 according to an example embodiment, and FIG. 8B is a diagram of an output of the interleaver 100 of FIG. 8A.

Referring to FIG. 8A, the interleaver 100 may include a first interleaving circuit 110, a second interleaving circuit 120, and/or an output buffer 130. Each of the first and second interleaving circuits 110 and 120 may receive a codeword CW and may perform interleaving on bits assigned thereto from among a plurality of bits of the codeword CW, in a mutually parallel fashion. For example, referring to FIG. 7A further, the first interleaving circuit 110 may generate an input index of the second sub-block SB2, and in a parallel fashion, the second interleaving circuit 120 may generate an input index of the third sub-block SB3. Each of the first and second interleaving circuits 110 and 120 may provide an interleaving result in the same temporal section to the output buffer 130. The output buffer 130 may output the interleaving result stored to correspond to a predetermined or alternatively, desired timing as an interleaved codeword I_CW.

Referring further to FIG. 8B, a first interleaving result with respect to bits of the codeword CW corresponding to an $x^{th}$ sub-block SBx from the first interleaving circuit 110 and a portion of a second interleaving result with respect to bits of the codeword CW corresponding to an $x+1^{th}$ sub-block SB(x+1) from the second interleaving circuit 120 may be simultaneously stored in the output buffer 130. In some example embodiments, according to a size of the output buffer 130, the entirety of the second interleaving result may be stored in the output buffer 130 simultaneously with the first interleaving result.

Via this configuration and operation of the interleaver 100 described above, a block-based interleaving operation may be quickly performed, and the performance of interleaving may be improved.

Figure 9:
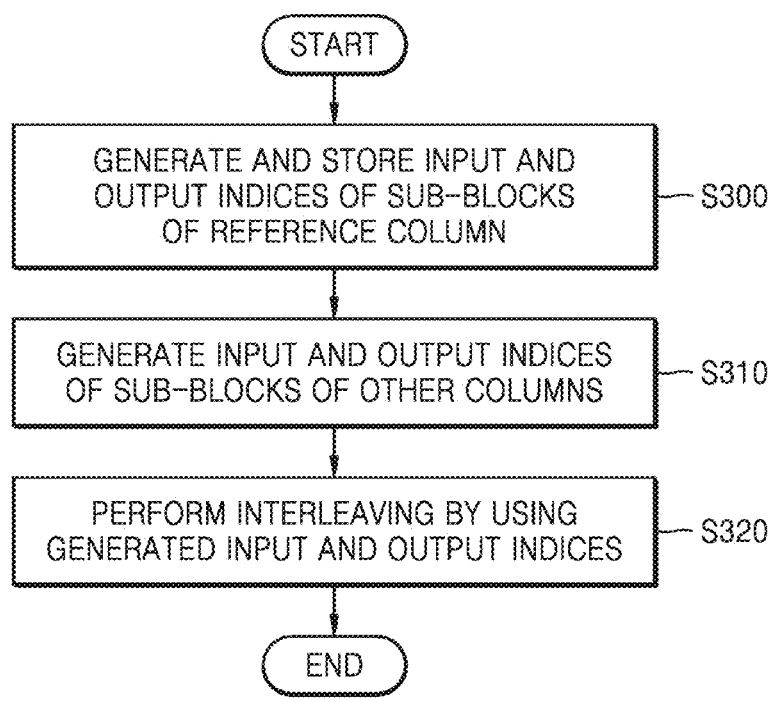
FIG. 9 is a flowchart of a block interleaving operation of an interleaver, according to an example embodiment.

FIG. 9 is a flowchart of a block interleaving operation of an interleaver, according to an example embodiment.

Referring to FIG. 9, in operation S300, the interleaver may generate and store input and output indices of sub-blocks in a reference column. In operation S310, the interleaver may generate input and output indices of sub-blocks in other columns by using the stored input and output indices. For example, a predetermined or alternatively, desired relationship may be formed between the sub-blocks in the reference column and the sub-blocks in the other columns, and by taking this relationship into account, the interleaver may generate the input indices of the sub-blocks of the other columns by adding a predetermined or alternatively, desired constant to the stored input indices. The interleaver may generate the output indices of the sub-blocks based on the algorithm described with reference to FIG. 3. In operation S310, the interleaver may perform interleaving by using the generated input and output indices.

Figure 10:
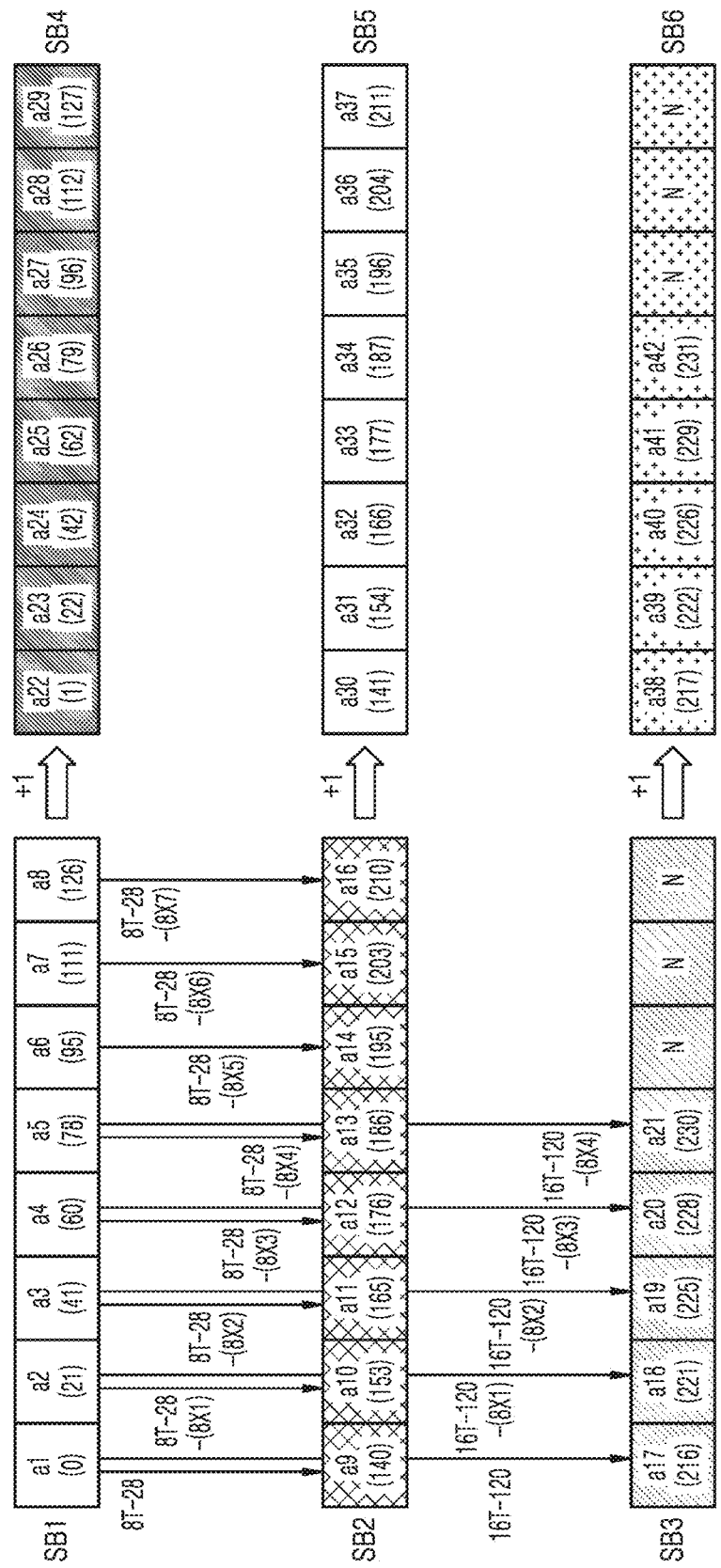
FIG. 10 is a detailed diagram of an operation of an interleaver, according to an example embodiment.

FIG. 10 is a detailed diagram of an operation of an interleaver, according to an example embodiment. The example embodiment illustrated in FIG. 10 is based on the example embodiments illustrated in FIGS. 4 and 9.

Referring to FIG. 10, the interleaver may generate the input indices of the first through third sub-blocks SB1 through SB3 as described above with reference to FIG. 7A and may generate the input indices of the fourth through sixth sub-blocks SB4 through SB6 by using the generated input indices of the first through third sub-blocks SB1 through SB3.

According to an example embodiment, a relationship between the input index of the first sub-block SB1 arranged in the first column of the block BLK (FIG. 4) and the input index of the fourth sub-block SB4 arranged in the second column of the block BLK to be adjacent to the first sub-block SB1 in the second direction is the same as [Equation 8] below.

$$a(n+21)\_II\_SB4 = an\_II\_SB1 + c \quad \text{[Equation 8]}$$

A constant c may be determined according to a mutual distance between the first sub-block SB1 and the fourth sub-block SB4 in the second direction, and as illustrated in FIG. 10, the constant c may have a value of 1. Based on this configuration, for example, the constant c may have a value of 2, in a relationship between the first sub-block SB1 and a seventh sub-block (not shown) arranged in the third column of the block BLK to be parallel with the first sub-block SB1 in the second direction.

The above relationship may also include a relationship between the second sub-block SB2 and the fifth sub-block SB5 and between the third sub-block SB3 and the sixth sub-block SB6 arranged in parallel to each other in the second direction.

The interleaver may configure the first column as a reference column, may generate the input indices of the first through third sub-blocks SB1 through SB3 of the reference column and may store the generated input indices in the internal memory. Then, the interleaver may use the stored input indices to generate the input indices of the remaining sub-blocks including the fourth through sixth sub-blocks SB4 through SB6.

The interleaver according to an example embodiment may quickly generate the input indices of the remaining sub-blocks via a simple calculation by using the input indices of the sub-blocks of the reference column. Thus, power consumption may be reduced or minimized, and the performance of interleaving may be improved.

Figure 11:
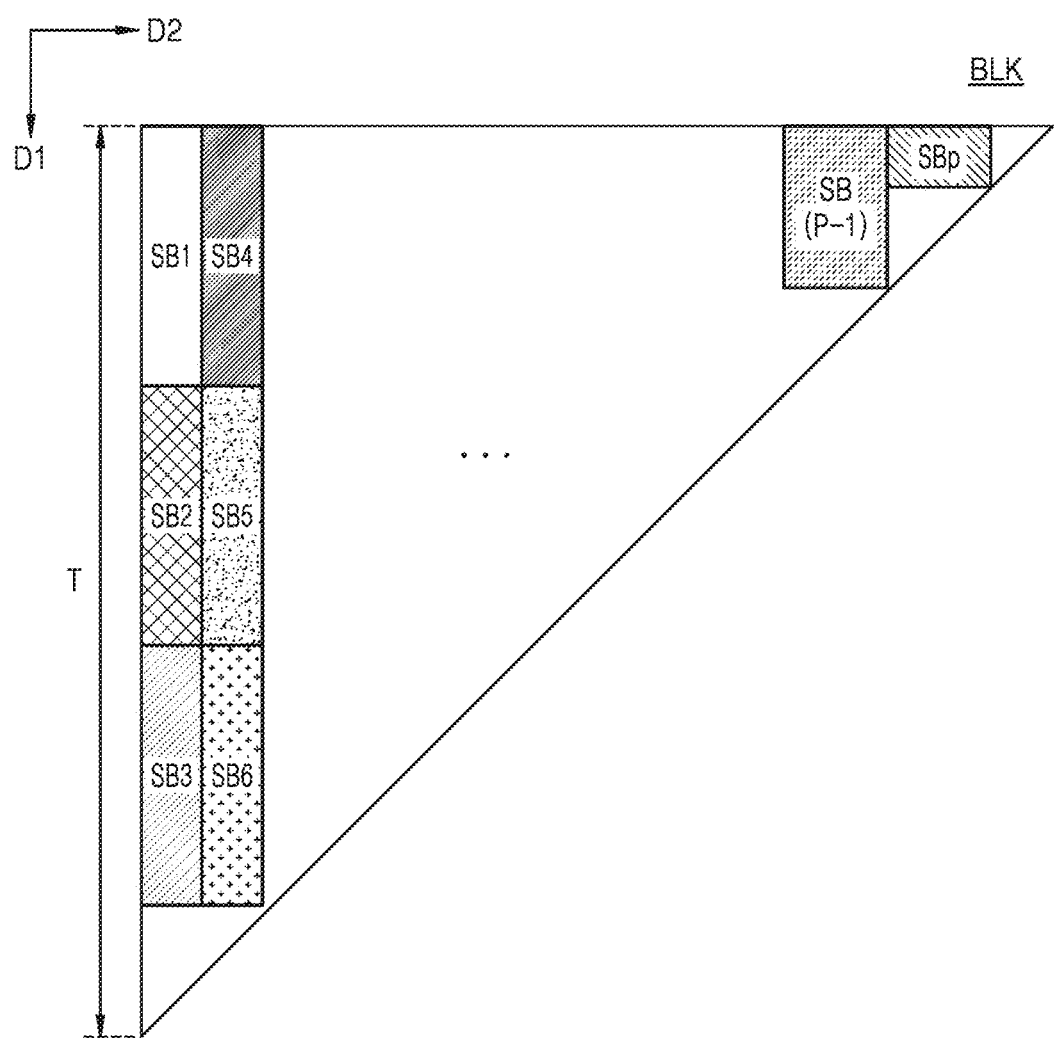
FIG. 11 is a diagram of a block according to an example embodiment.

FIG. 11 is a diagram of a block BLK according to an example embodiment. Hereinafter, aspects that are the same as the aspects of FIG. 4 are not described.

Referring to FIG. 11, the block BLK may further include $p-1^{th}$ and $p^{th}$ sub-blocks SB(p-1) and SBp. In some example embodiments, p is an integer equal to or greater than 7. The $p-1^{th}$ and $p^{th}$ sub-blocks SB(p-1) and SBp may have a different size from the first through sixth sub-blocks SB1 through SB6, due to a constraint of the shape of the block BLK. The $p-1^{th}$ and $p^{th}$ sub-blocks SB(p-1) and SBp may be configured to have various sizes according to a shape of the block BLK. Also, the block BLK may further include other sub-blocks (not shown) having different sizes from the first through sixth sub-blocks SB1 through SB6.

According to an example embodiment, the interleaver may generate input indices of the $p-1^{th}$ and $p^{th}$ sub-blocks SB(p-1) and SBp based on the example embodiments described with reference to FIGS. 9 and 10. A detailed example embodiment of this aspect is described below with reference to FIG. 12.

Figure 12:
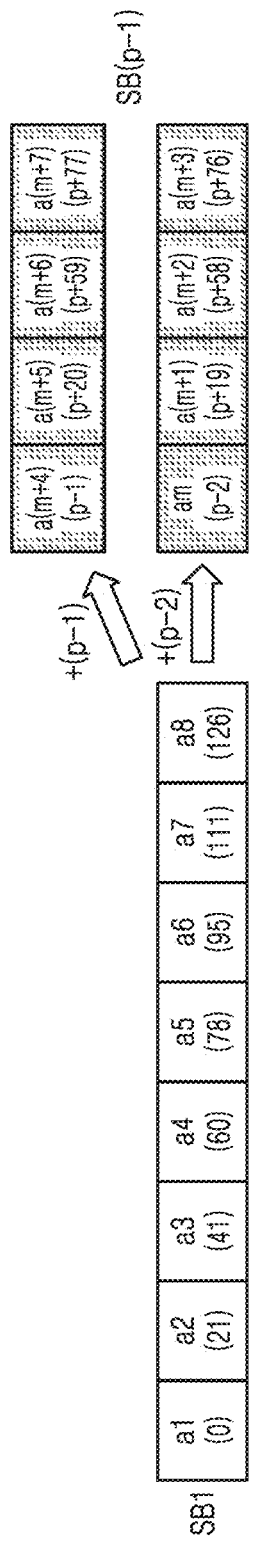
FIG. 12 is a diagram for describing an embodiment of generating input indices of a p-$1^{th}$ sub-block of FIG. 11.

FIG. 12 is a diagram of an example embodiment of generating the input index of the $p-1^{th}$ sub-block SB(p-1) of FIG. 11.

Referring to FIG. 12, the $p-1^{th}$ sub-block SB(p-1) may have a 4-bit length in the first direction and a 2-bit length in the second direction and may be arranged to extend from a $p-1^{th}$ column to a $p^{th}$ column of the block BLK. The $p-1^{th}$ sub-block SB(p-1) may include 8 elements am through a(m+7).

According to an example embodiment, the interleaver may generate the input index of the $p-1^{th}$ sub-block SB(p-1) by using the input index of the first sub-block SB1 of the reference column. For example, in a relationship between the first sub-block SB1 and the elements am through a(m+3) of the $p-1^{th}$ sub-block SB(p-1) in the $p-1^{th}$ column, the constant c of [Equation 8] of FIG. 10 may have a value of p-2. Also, in a relationship between the first sub-block SB1 and the elements a(m+4) through a(m+7) of the $p-1^{th}$ sub-block SB(p-1) in the $p^{th}$ column, the constant c of [Equation 8] of FIG. 10 may have a value of p-1.

Based on this relationship, the interleaver may generate the input index of the $p-1^{th}$ sub-block SB(p-1) by adding each of the constants to the input index of the first sub-block SB1. The interleaver may generate input indices having values of p-2, p+19, p+58, and p+76 corresponding to the elements am through a(m+3) of the $p-1^{th}$ column and may generate input indices having values of p-1, p+20, p+59, and p+77 corresponding to the elements a(m+4) through a(m+7) of the $p^{th}$ column. In some example embodiments, a sub-block corresponding to an input index used to generate the input index of the $p-1^{th}$ sub-block SB(p-1) may not be limited to the sub-block of the reference column and may vary. For example, the input index of the $p-1^{th}$ sub-block SB(p-1) may be generated by using an input index of a sub-block (not shown) arranged in a $p-2^{th}$ column.

The interleaver may generate the input index of the $p^{th}$ sub-block SBp having the different size from the first through sixth sub-blocks SB1 through SB6 by using the same method as described above.

The interleaver according to an example embodiment may use the relationship between the sub-blocks having different sizes and may rapidly generate the input indices via a simple calculation. Thus, power consumption may be reduced or minimized and the performance of interleaving may be improved.

Figure 13:
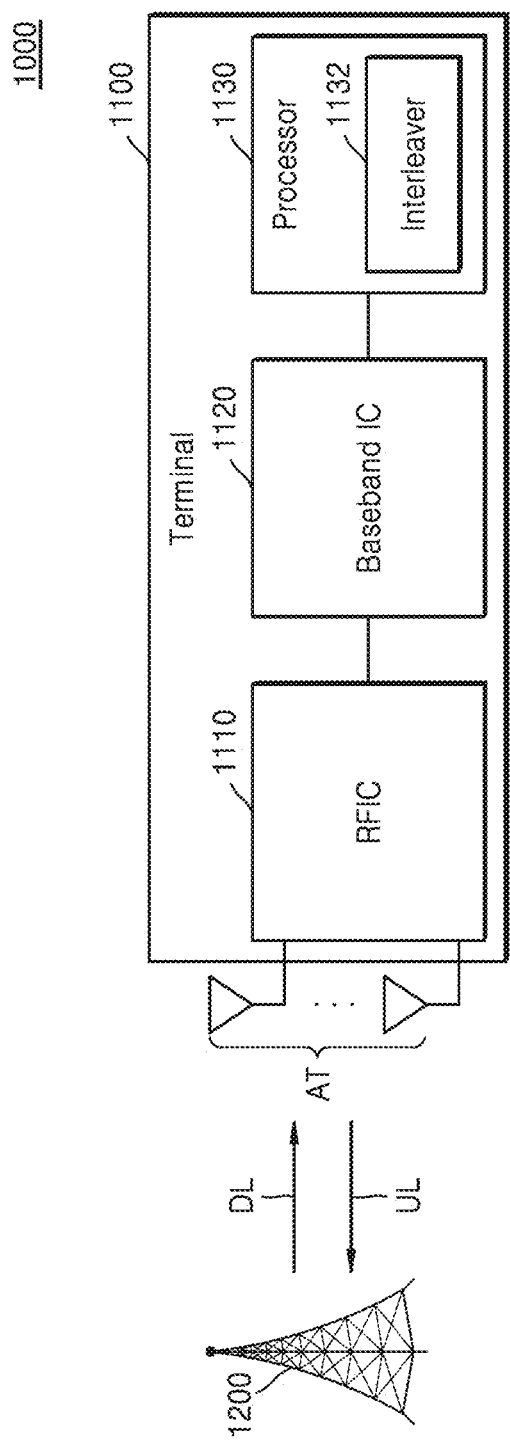
FIG. 13 is a block diagram of a communication system according to an example embodiment.

FIG. 13 is a block diagram of a communication system 1000 according to an example embodiment.

Referring to FIG. 13, the communication system 1000 may include a terminal 1100 and a BS 1200. The terminal 1100 may include a wireless communication device and may be mobile. The terminal 1100 may communicate with the BS 1200 through a downlink channel DL and an uplink channel UL to transmit and receive data and control information to and from the BS 1200.

The interleaving methods according to the example embodiments may be used for a transmission of a physical uplink control channel (PUCCH) of the uplink channel UL. Further, when the communication system 1000 supports vehicle-to-everything (V2X) communication, the interleaving methods may be used for a transmission of a physical sidelink control channel (PSCCH) to another terminal (not shown). However, this is only an example embodiment. The inventive concepts are not limited thereto and may be applied to other various control channels.

The terminal 1100 may include a plurality of antennas AT, a radio frequency (RF) integrated circuit 1110, a baseband integrated circuit 1120, and/or a processor 1130. The terminal 1100 according to the example embodiment illustrated in FIG. 13 is only an example. The terminal 1100 is not limited thereto and may include more or less components than the illustrated components. Also, in some example embodiments, the RF integrated circuit 1110 and the baseband integrated circuit 1120 may be implemented to be included in one integrated circuit.

The RF integrated circuit 1110 may perform, conversion of a band of a signal, amplification of a signal, etc., for transceiving the signal through a radio channel by using the plurality of antennas AT. For example, the RF integrated circuit 1110 may perform uplink conversion on a baseband signal received from the baseband integrated circuit 1120 to make an RF band signal, may transmit the RF band signal through the antennas AT, and may perform downlink conversion on the RF band signal received through the antennas AT. For example, the RF integrated circuit 1110 may include a transmission filter, a reception filter, an amplifier, a mixer, an oscillator, a digital-to-analog converter (DAC), an analog-to-digital converter (ADC), etc. Also, the RF integrated circuit 1110 may further include a plurality of RF chains (not shown) and may perform beamforming using the antennas AT. For beamforming, the RF integrated circuit 1110 may adjust a phase and a magnitude of each of signals transceived through the antennas AT. Further, the RF integrated circuit 1110 may perform a multi-input and multi-output (MIMO) operation and may receive a plurality of layers while performing the MIMO operation.

The baseband integrated circuit 1120 may perform conversion between a baseband signal and a bit stream according to a physical hierarchical standard of a system. For example, the baseband integrated circuit 1120 may generate complex symbols by encoding and modulating a transmission bit stream during data transmission. Also, the baseband integrated circuit 1120 may reconstruct a received bit stream by demodulating and decoding the baseband signal provided from the RF integrated circuit 1110 during data reception.

The RF integrated circuit 1110 and the baseband integrated circuit 1120 may transceive the signal as described above. The RF integrated circuit 1110 and the baseband integrated circuit 1120 may also be referred to as a transmitter, a receiver, a transceiver, or a communicator. Furthermore, at least one of the RF integrated circuit 1110 and the baseband integrated circuit 1120 may include a plurality of communication modules for supporting a plurality of different wireless access technologies. Also, at least one of the RF integrated circuit 1110 and the baseband integrated circuit 1120 may include different communication modules for processing signals of different frequency bands. For example, the different wireless access technologies may include NR technology, LTE technology, etc. Also, the different frequency bands may include a super high frequency band, a millimeter band, etc. The terminal 1100 may communicate with the BS 1200 by using the RF integrated circuit 1110 and the baseband integrated circuit 1120.

The processor 1130 may control general operations of the terminal 1100. According to an example embodiment, the processor 1130 may include an interleaver 1132 performing interleaving according to example embodiments of the inventive concepts. The interleaver 1132 may generate input and output indices of sub-blocks of a block via a simple calculation by using a sequential relationship between the sub-blocks. The interleaver 1132 may configure a size of the sub-blocks to satisfy the sequential relationship.

As the hardware of the interleaver 1132 is simplified, and power consumption is reduced or minimized, according to the example embodiments, the burden of the processor 1130 due to interleaving may be reduced, and the performance of the processor 1130 may be improved.

The processor 1130 may perform coding on a predetermined or alternatively, desired control channel, may interleave a codeword generated as a result of the coding by using the interleaver 1132, and then, may transmit the interleaved codeword to the BS 1200 or another terminal (not shown) by using the RF integrated circuit 1110 and the baseband integrated circuit 1120.

Figure 14:
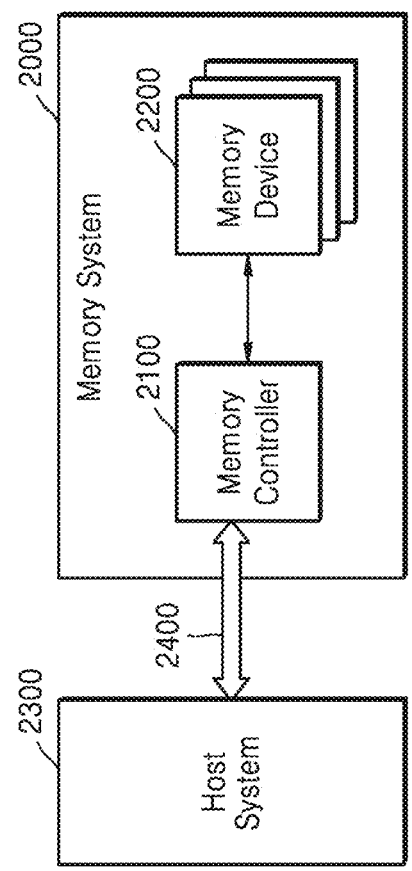
FIG. 14 is a block diagram of systems according to an example embodiment.

FIG. 14 is a block diagram of a memory system 2000 and a host system 2300 according to an example embodiment. As illustrated in FIG. 14, the memory system 2000 and the host system 2300 may communicate with each other through an interface 2400, and the memory system 2000 may include a memory controller 2100 and memory devices 2200.

The interface 2400 may use an electrical signal and/or an optical signal and, for example, may include, but is not limited to, a serial advanced technology attachment (SATA) interface, a SATA express (SATAe) interface, a serial attached small computer system (SAS) interface, a serial attached small computer system interface (SCSI), a universal serial bus (USB) interface, or a combination thereof. The host system 2300 and the memory controller 2100 may include a serializer/deserializer (SerDes) for serial communication.

In some example embodiments, the memory system 2000 may be removably coupled to the host system 2300 to communicate with the host system 2300. The memory devices 2200 may include a volatile memory or a nonvolatile memory, and the memory system 2000 may also be referred to as a storage system. For example, the memory system 2000 may be realized as a solid-state drive or solid-state disk (SSD), an embedded SSD (eSSD), a multimedia card (MMC), an embedded MMC (eMMC), etc., but is not limited thereto. The memory controller 2100 may control the memory devices 2200 in response to a request received from the host system 2300 through the interface 2400.

An interleaver (not shown) performing interleaving according to example embodiments of the inventive concepts may be realized in a form in which an ADC is included in each of the memory controller 2100, the memory devices 2200, and the host system 2300. For example, the memory controller 2100, the memory devices 2200, and the host system 2300 may interleave a predetermined or alternatively, desired codeword including an ECC or predetermined or alternatively, desired data by using the interleaver according to the example embodiments of the inventive concepts and may transmit the interleaved codeword or data.

Figure 15:
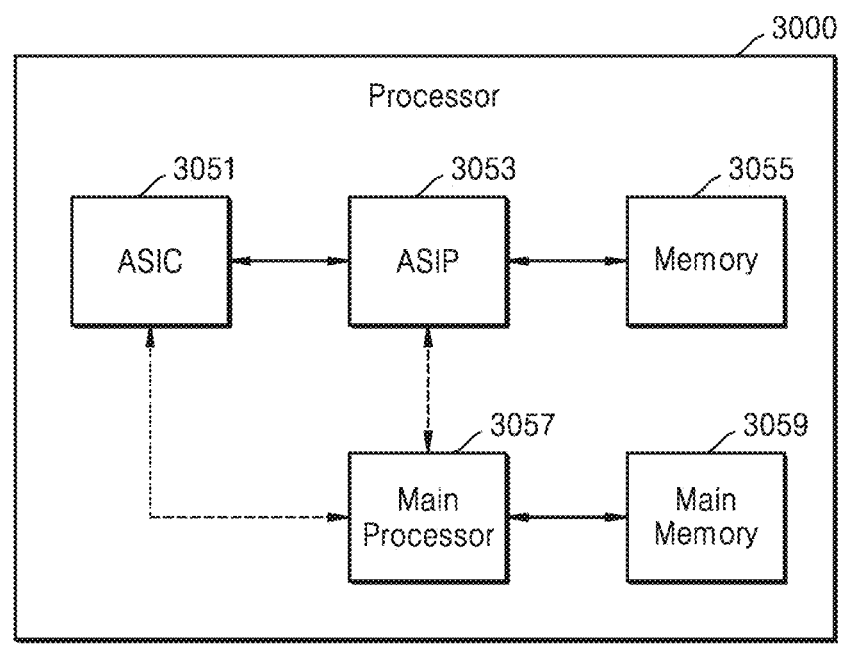
FIG. 15 is a block diagram of a processor according to an example embodiment.

FIG. 15 is a block diagram of a processor 3000 according to an example embodiment. In some example embodiments, the interleaver 100 of FIG. 1 may be included in the processor 3000 of FIG. 15.

As illustrated in FIG. 15, the processor 3000 may include an application specific integrated circuit (ASIC) 3051, an application specific instruction set processor (ASIP) 3053, a memory 3055, a main processor 3057, and a main memory 3059. In some example embodiments, two or more of the ASIC 3051, the ASIP 3053, and the main processor 3057 may communicate with each other. Also, in some example embodiments, at least two of the ASIC 3051, the ASIP 3053, the memory 3055, the main processor 3057, and the main memory 3059 may be embedded in one semiconductor chip.

The ASIP 3053 may be an integrated circuit customized for a specific purpose, may support an exclusive instruction set for a specific application, and may execute instructions included in the instruction set. The memory 3055 may communicate with the ASIP 3053, may be a non-temporary storage device, and may include the plurality of instructions executed by the ASIP 3053. For example, the memory 3055 may include, but is not limited to, a predetermined or alternatively, desired tangible memory that is accessible by the ASIP 3053, such as random-access memory (RAM), read-only memory (ROM), tape, a magnetic disk, an optical disk, a volatile memory, a non-volatile memory, and a combination thereof. In some example embodiments, the memory 3055 may store an input index of a reference sub-block, which is used to generate input indices of other sub-blocks.

The main processor 3057 may control the processor 3050 by executing a plurality of instructions. For example, the main processor 3057 may control the ASIC 3051 and the ASIP 3053. The main memory 3059 may communicate with the main processor 3057 and may include a predetermined or alternatively, desired tangible memory accessible by the main processor 3057. In some example embodiments, the main memory 3059 may include a non-temporary storage device and may store a plurality of instructions executed by the main processor 3057.

Interleaving according to example embodiments may be performed by at least one of the components included in the processor 3000 of FIG. 15. For example, one or more of the operations of the interleaver 100 of FIG. 1 may be implemented via the plurality of instructions stored in the memory 3055. The ASIP 3053 may perform the one or more interleaving operations by executing the plurality of instructions stored in the memory 3055. In some example embodiments, at least one of the interleaving operations may be executed by a hardware block designed through logic synthesis, etc. In some example embodiments, at least one of the interleaving operations may be implemented via a plurality of instructions stored in the main memory 3059. The main processor 3057 may perform the at least one of the interleaving operations by executing the plurality of instructions stored in the main memory 3059.

One or more of the elements or functional blocks disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. An apparatus comprising:
an encoder configured to generate a codeword composed of a plurality of bits by encoding source data; and
an interleaver configured to perform, on the codeword, block-based interleaving comprising a plurality of sub-blocks, wherein
the interleaver is configured to:
generate a first reference input index of a first reference sub-block from among the sub-blocks;
generate, based on the first reference input index, a first input index of a first sub-block from among the sub-blocks, the first sub-block being arranged to be adjacent to the first reference sub-block in a first direction; and
store, in an internal memory, bits corresponding to the first reference sub-block and the first sub-block, according to the first reference input index and the first input index, respectively,
wherein the block has a shape of a right angle isosceles triangle, and
wherein the interleaver is further configured to generate the first input index based on the first reference input index through addition, subtraction, and a bit shift operation based on a sequential relationship between the first reference sub-block and the first sub-block.

2. The apparatus of claim 1, wherein each of the first reference sub-block and the first sub-block has a $2^n$ bit length in the first direction and a 1-bit length in a second direction intersecting with the first direction, n being an integer equal to or greater than 1.

3. The apparatus of claim 1, wherein the interleaver is further configured to generate output indices of the first reference sub-block and the first sub-block and output, according to the output indices, the bits corresponding to the first reference sub-block and the first sub-block from the internal memory.

4. The apparatus of claim 1, wherein the interleaver is further configured to: generate a second reference input index of a second reference sub-block from among the sub-blocks, the second reference sub-block being adjacent to the first reference sub-block in a second direction intersecting with the first direction; generate, based on the second reference input index, a second input index of a second sub-block from among the sub-blocks, the second sub-block being arranged in parallel with the second reference sub-block in the first direction; and store, in the internal memory, bits corresponding to the second reference sub-block and the second sub-block, according to the second reference input index and the second input index, respectively.

5. The apparatus of claim 1, wherein the interleaver is further configured to generate, based on the first reference input index, a second input index of a second sub-block from among the sub-blocks, the second sub-block being arranged to be adjacent to the first sub-block in the first direction.

6. The apparatus of claim 5, wherein the interleaver is further configured to perform the generation of the first input index and the generation of the second input index in a parallel fashion.

7. The apparatus of claim 6, further comprising an output buffer, wherein
the interleaver is further configured to store an interleaving result with respect to the first sub-block and an interleaving result with respect to the second sub-block in a same temporal section in the output buffer.

8. The apparatus of claim 1, wherein the interleaver is further configured to generate a second input index of a second sub-block arranged to be adjacent to the first sub-block in a second direction intersecting with the first direction, by using the first input index.

9. The apparatus of claim 6, wherein the interleaver is further configured to generate the second input index by summing a constant corresponding to a distance between the first sub-block and the second sub-block with the first input index.

10. The apparatus of claim 1, further comprising:
a de-interleaver configured to perform block-based de-interleaving on a signal received from an external source; and
a decoder configured to decode the de-interleaved signal, wherein
the de-interleaver is configured to perform an operation corresponding to an operation of the interleaver.

11. A block-based interleaving method comprising a plurality of sub-blocks and performed on a codeword composed of a plurality of bits, the method comprising:
generating a first reference input index of a first reference sub-block from among the sub-blocks;
generating, based on the first reference input index, a first input index of a first sub-block from among the sub-blocks, the first sub-block being arranged to be adjacent to the first reference sub-block in a first direction, each of the first reference sub-block and the first sub-block having a $2^n$ bit length in the first direction and a 1-bit length in a second direction intersecting with the first direction, and n being an integer equal to or greater than 1; and
storing bits corresponding to the first reference sub-block and the first sub-block.

12. The block-based interleaving method of claim 11, further comprising:

generating a second input index of a second sub-block from among the sub-blocks, the second sub-block being adjacent to the first sub-block in the first direction, wherein the generation of the first input index and the generation of the second input index are performed in a mutually parallel fashion.

13. The block-based interleaving method of claim 11, further comprising:

generating output indices of the first reference sub-block and the first sub-block; and outputting, according to the output indices, the bits corresponding to the first reference sub-block and the first sub-block from an internal memory.

14. An apparatus comprising:

a memory;

a processor configured to: encode source data and generate a codeword composed of a plurality of bits; and perform, on the codeword, block-based interleaving comprising a plurality of sub-blocks; and an integrated circuit configured to output data including the interleaved codeword through a channel, wherein the processor is further configured to:

generate first input indices of first sub-blocks from among the sub-blocks, the first sub-blocks corresponding to a first column, based on a sequential relationship between the first sub-blocks, each of the first sub-blocks having a $2^n$ bit length in a first direction and a 1-bit length in a second direction intersecting with the first direction, and n being an integer equal to or greater than 1;

store bits corresponding to the first sub-blocks in the memory; and output the bits stored in the memory according to first output indices of the first sub-blocks.

15. The apparatus of claim 14, wherein the processor is further configured to generate the first input indices based on a reference input index of a reference sub-block from among the first sub-blocks through addition, subtraction, and shifting.

16. The apparatus of claim 14, wherein the processor is further configured to generate, by using the first input indices, second input indices of second sub-blocks from among the sub-blocks, the second sub-blocks corresponding to a second column.

17. The apparatus of claim 16, wherein the processor is further configured to generate the second input indices by summing a constant corresponding to a distance difference between the first sub-blocks and the second sub-blocks in a row direction with the first input indices.

18. The apparatus of claim 5, wherein each of the first reference sub-block and the first sub-block has a $2^n$ bit length in the first direction and a 1-bit length in a second direction intersecting with the first direction, n being an integer equal to or greater than 1; and the interleaver is configured to generate the second input index based on a bit shift operation, the bit shift operation being based on the bit length in the first direction of the first sub-block.

* * * * *